United States Patent [19]

Davies et al.

[11] Patent Number: 4,645,707
[45] Date of Patent: Feb. 24, 1987

[54] SEMICONDUCTOR DEVICES

[75] Inventors: Richard A. Davies, Harrow; Michael J. Kelly, London, both of England

[73] Assignee: The General Electric Company, p.l.c., England

[21] Appl. No.: 799,627

[22] Filed: Nov. 19, 1985

[51] Int. Cl.⁴ .................. B32B 7/02; H01L 27/12
[52] U.S. Cl. ........................... 428/213; 357/4; 357/30; 427/87; 428/901
[58] Field of Search ............... 357/4, 30, 61; 427/87; 428/213

[56] References Cited

U.S. PATENT DOCUMENTS

| 4,503,447 | 3/1985 | Iafrate et al. | 357/16 |
| 4,511,408 | 4/1985 | Holonyak, Jr. | 148/1.5 |
| 4,517,047 | 5/1985 | Chang et al. | 156/610 |
| 4,558,336 | 12/1985 | Chang et al. | 357/4 |
| 4,591,889 | 5/1986 | Gossard et al. | 357/4 |

Primary Examiner—John E. Kittle
Assistant Examiner—Patrick Ryan
Attorney, Agent, or Firm—Kirschstein, Kirschstein, Ottinger & Israel

[57] ABSTRACT

A semiconductor device incorporating two superlattices in the GaAs/AlGaAs system separated by a relatively thick layer of GaAlAs is described. The device displays negative differential conductance.

9 Claims, 4 Drawing Figures

SEMICONDUCTOR DEVICES

BACKGROUND OF THE INVENTION

1. Field of the Invention

This invention relates to semiconductor devices. In particular the invention relates to semiconductor devices incorporating a superlattice.

2. Description of the Prior Art

Superlattices comprise a periodic structure consisting of alternating ultra-thin layers of two different semiconductor materials, the semiconductor materials being chosen such that there is a misalignment of energy band edges between each pair of adjacent layers, with the layers of one of the materials constituting potential barriers to charge carriers passing through the superlattice.

The original work on these structures was performed by L. Esaki and L.L. Chang, and is described in Physical Review Letters, Volume 33, pages 495 to 498. A recent review article on superlattices is given in Proceedings of the 17th International Conference on Physics of semiconductors, edited by Chadi and Harrison, Published by Springer Verlag in 1985, pages 473 to 483.

SUMMARY OF THE INVENTION

It is an object of the present invention to provide a semiconductor device incorporating a superlattice, the device exhibiting negative differential conductance.

A semiconductor device in accordance with the invention achieves this object by comprising two superlattices each comprising alternating layers of two different semiconductor materials such that there is a misalignment of energy band edges between each pair of adjacent layers with the layers of one of the materials constituting potential barriers to charge carriers passing through each superlattice, said superlattices being coupled to each other by a barrier layer of semiconductor material forming respective heterojunctions with the adjacent layers of the superlattices, said barrier layer having a lower transmission coefficient for said charge carriers than said layers of said one material, said superlattices defining the allowed energy levels of said charge carriers at either side of said barrier layer and the value of a potential applied across said barrier layer determining the current-voltage characteristics of the device.

DETAILED DESCRIPTION

Figure 1:
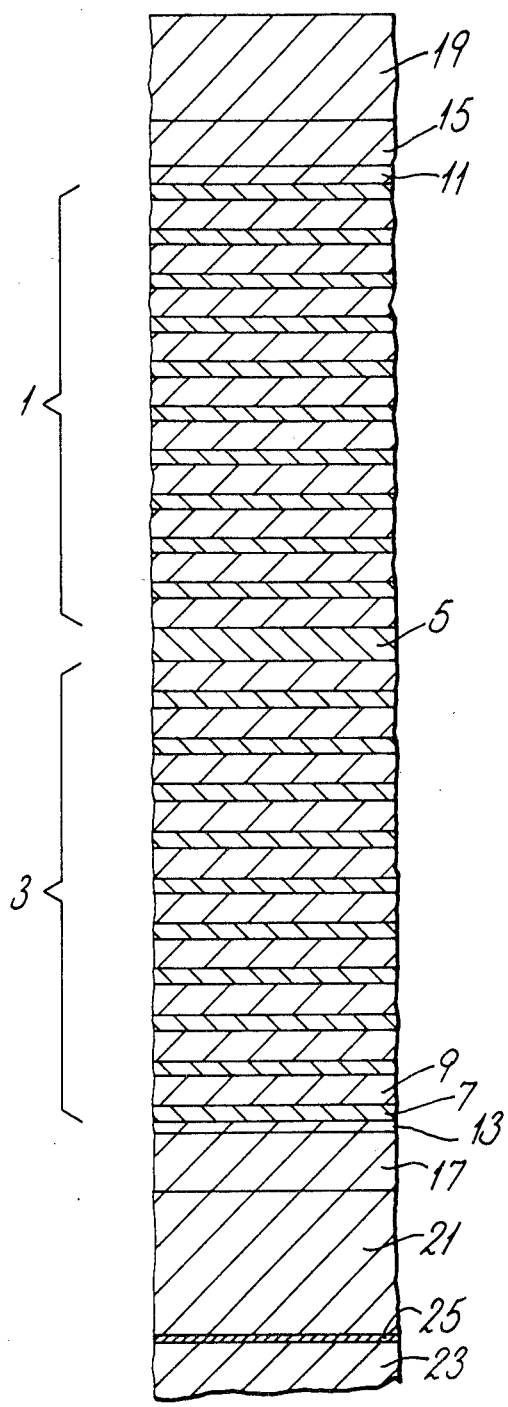
FIG. 1 is a schematic side view of a device in accordance with the invention, with the vertical scale greatly expanded for clarity.

Referring firstly to FIG. 1, the device comprises two compositional superlattices 1, 3 separated by a 8 nanometer thick barrier layer of $Al_{0.25}Ga_{0.75}As$ 5. Each superlattice 1, 3 is constituted by ten layers of $Al_{0.25}Ga_{0.75}As$ 7 each approximately 3 nanometers thick, alternating with ten layers of GaAs 9 each approximately 6 nanometers thick. Each GaAs layer 9 within the superlattices 1, 3 is doped with silicon at a level of $4 \times 10^{17} cm^{-3}$ over the central 2 nanometers. Respective approximately 2 nanometer thick GaAs layers 11, 13 are formed at the end of each superlattice remote from the barrier layer 5, with respective 40 nanometer thick GaAs layers 15, 17 doped with silicon to $10^{17} cm^{-3}$ being formed at either side of the layers 11, 13. Further capping layers 19, 21 of GaAs doped with silicon to $10^{18} cm^{-3}$ are formed on the layers 15, 17 respectively, the whole device being formed on a GaAs substrate 23 separated from the layer 21 by a very thin layer 25 of AlAs, between 0.5 to 1 nanometer thick which acts as a barrier to defect diffusion from the substrate.

The device as described is grown by molecular beam epitaxy from the substrate 23. Respective electrical contacts (not shown) are then formed to the upper capping layer 19 and by etching to the lower capping layer 21.

Figure 2:
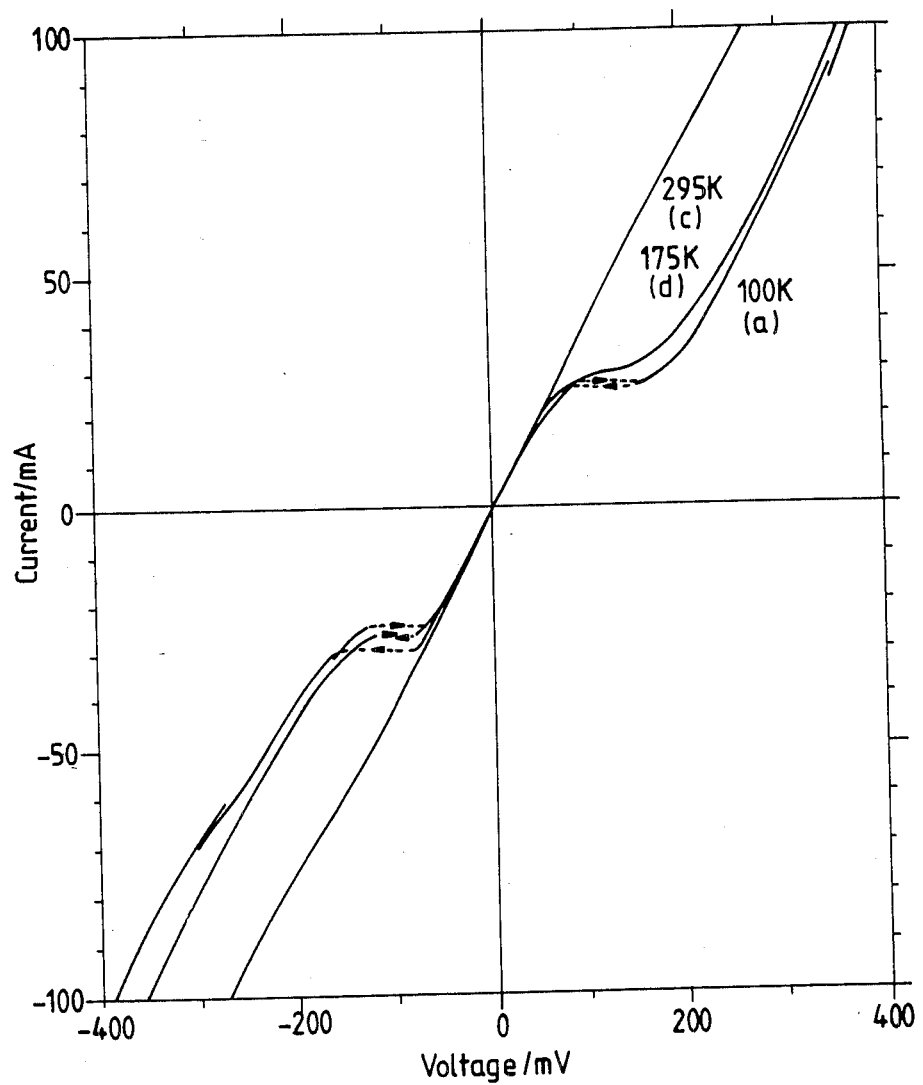
FIG. 2 shows the measured current voltage characteristic of the device.

By applying a bias across the device via the electrical contacts, the current voltage characteristics shown in FIG. 2 may be measured. The most notable features in these curves are the discontinuous voltage steps at certain currents which exhibit a hysteresis dependent on the direction of the current sweep. It is well known in the art of measurement of such semiconductor characteristic curves that self resonance due to the reactance of the device and the measuring circuit causes such measured characteristics to deviate from the true current voltage characteristic. Measurement of the derivative $\partial V/\partial I$ shows that this derivative diverges as the discontinuity in voltage is approached, i.e. that the slope $\partial I/\partial V$ becomes zero. This behaviour indicates that the true I-V characteristic is of the general form shown in FIG. 3, this characteristic showing a region of negative differential conductivity, the value of V shown in this Figure being the potential drop across the layer 5, most of the voltage across the device being actually dropped across this layer.

The I-V characteristics of the device are temperature independent below about 100 K. Above this temperature as can be seen in plots (b) and (c) in FIG. 2 the voltage steps decrease with temperature and the hysteresis loops shrink and eventually disappear leaving a smooth characteristic at room temperature which is only slightly non-ohmic. In the ohmic regions away from the voltage steps the resistances measured at each temperature are very similar. The measurements shown in FIG. 2 were taken under dark conditions, but were unchanged under illumination of the device.

Figure 4:
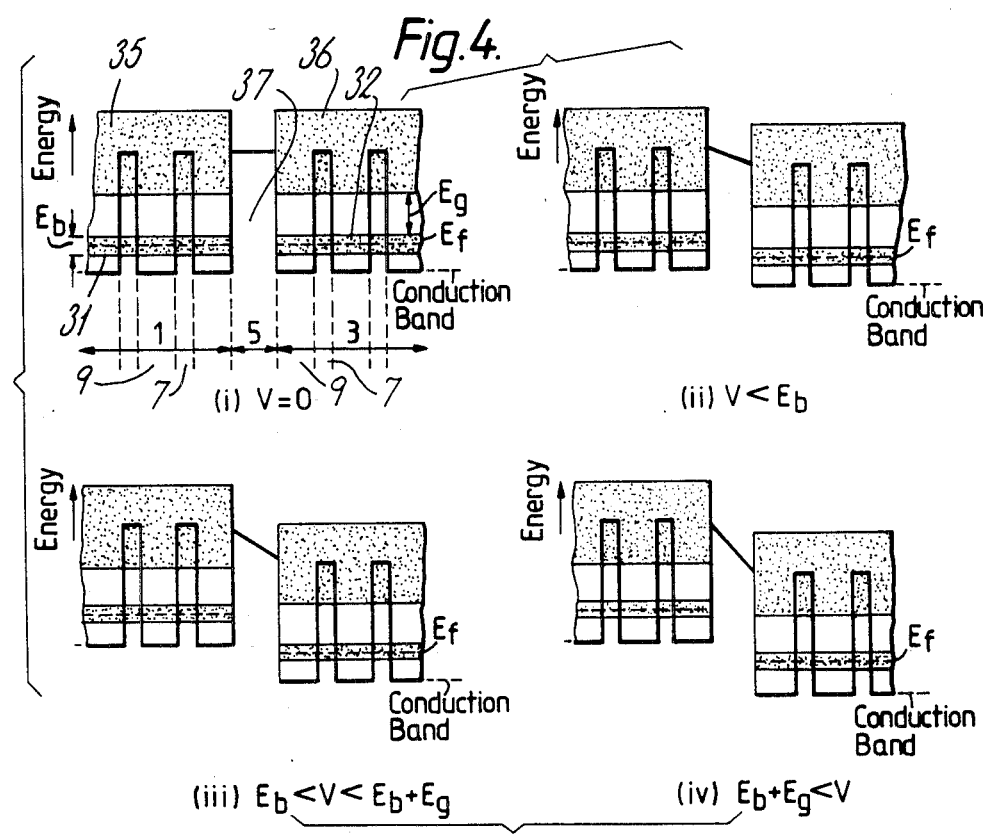
FIG. 4 illustrates part of the conduction band for the central portion of the device, at four different applied bias voltages.

The characteristics of the device may be explained with reference to FIG. 4 which shows the conduction band edge 29 at the centre of the device for four different values of applied bias voltage V. Referring firstly to FIG. 4 (i), as in each of the superlattices 1, 3 the energies of the two conduction band minima for the layers 9 of $Al_{0.25}Ga_{0.75}As$ and layers 11 of GaAs are different, the GaAs layers 11 constitute potential wells, confined by the $Al_{0.25}Ga_{0.75}As$ layers 9 which each constitute thin potential barriers. As the layers 9, 11 are so thin that they are strongly coupled, the bound electron states in the wells overlap forming 'minibands' of typical widths and separations of tens of millielectron volts. The first two such minibands are shown in FIG. 4, the first minibands 31, or 32 having a width of $E_b$ and being separated from the second minibands 35, or 36 by respective energy gaps of $E_g$. The doping levels for the GaAs layers 11 within the device are chosen such that the Fermi level $E_f$ lies near the middle of the first miniband 31 or 32 as shown, the doping being spaced away from the AlGaAs layers to minimise problems associated with deep donors. Within each superlattice 1, 3 metallic conduction occurs in the first miniband with most of the applied bias dropped across the thick tunnel barrier 37 constituted by the layer 5 separating the two superlattices 1, 3. The amount of conduction through this barrier 37 will depend on the overlap in energy of the minibands at each side of the barrier as further described hereafter.

For low levels of bias, i.e. for values of V of less than $E_b$ as shown in FIG. 4 (ii) electrons can tunnel from the first miniband 31 on one side of the barrier 37 to the first miniband 32 on the other side, so that the conduction appears Ohmic. Once the voltage drop across the tunnel barrier 37 exceeds the width of the first miniband 31 however as shown in FIG. 4(iii) there are no states available for the electrons to tunnel into and conduction is only possible if the electrons lose energy by emitting phonons. Generally the width $E_b$ of the first miniband 31 or 32 will be chosen to be less than the optic phonon energy for GaAs so as to prevent electrons losing energy in this manner.

Figure 3:
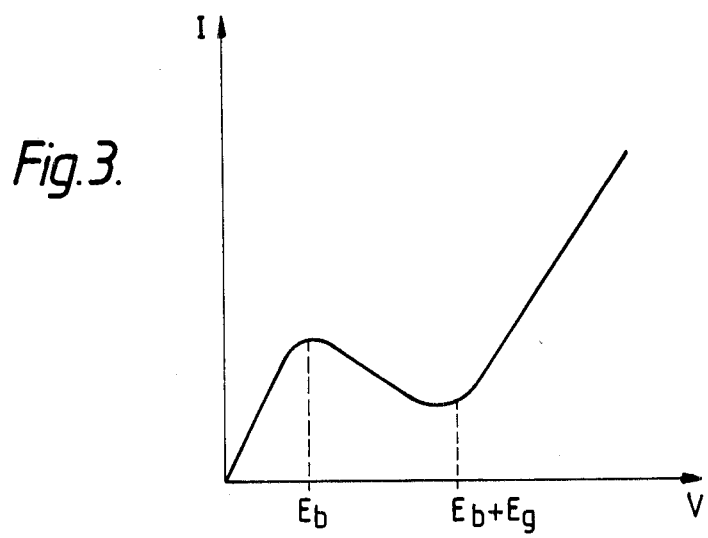
FIG. 3 illustrates part of the true current voltage characteristic of the device.

Thus the region of negative differential conductance indicated by the drop in current shown in FIG. 3 for this applied voltage results.

The current will increase again only, when as shown in FIG. 4(iv) the bias is increased by an amount equal to the separation $E_g$ of the first and second minibands 31 and 35 or 32 and 36. At this point electrons may tunnel elastically through the barrier 37 from the first miniband 31 at one side of the barrier 37 to the second miniband 36 at the other side of the barrier.

The amount of negative differential conductance may be increased in several ways. Firstly the gap in energy $E_g$ between the first and second minibands can be increased by decreasing each well thickness within each superlattice 1,3 and increasing the barrier height constituted by the AlGaAs layers by increasing the aluminium content. This will reduce the current associated with thermal activation and increase the voltage range of the negative differential resistance which is closely related to the energy $E_g$. This will in turn increase the avilable power, efficiency and operating temperature of the device, when for example used in an oscillator. Values which can readily be realised are 5nm wide wells with 3nm barriers containing 45% aluminium.

The current density of the device can be increased by making the layer 5 constituting the thick tunnel barrier thinner. This will also increase the relative amount of direct tunnelling and so increase the peak to valley ratio of the current swing again improving available power, efficiency and increasing the operating temperature. As however most of the applied bias must be dropped across this layer, the thickness of this layer cannot be reduced too much. A thickness of twice the barriers within the superlattices 1,3 is regarded as a good compromise. The practical upper limit on the operating frequency of the device is determined by the capacitance associated with the high field region around the thick barrier layer but the greater current density associated with thinner barrier layers allows a much smaller area device to be used for the same output power, thus giving a reduction in capacitance even for relatively thin layers.

To reduce the threshold voltage for negative differential conductance, and so increase the efficiency of the device it is necessary to reduce the series resistance of the device as much as possible. This may be achieved by reducing the number of layers within each superlattice to the minimum required to give minibands. Generally three periods of superlattice on each side of the thick barrier layer should be adequate. For the same reason doping levels should be high as possible.

It will be appreciated that whilst in the device described herebefore by way of example, the charge carriers are electrons, a device in accordance with the invention in which the charge carriers are holes is equally possible. Such a device will of course operate due to the misalignment of the valence band edges of the materials constituting the device.

It will also be appreciated that whilst the device described herebefore by way of example includes two compositional superlattices in the GaAs/AlGaAs system, many other combinations of material are possible, e.g. doping superlattices, and materials in the InAs/GaSb system. Furthermore the two superlattices need not be identical.

It will also be appreciated that whilst in the device described herebefore by way of example the barrier layer coupling the two superlattices is of the same material as but thicker than the layers of material constituting potential barriers within the two superlattices, it is possible for this barrier layer to be of a different material, as long as it can form respective heterojunctions with the adjacent layers of the superlattices. Where the barrier layer is of a different material, it need not necessarily be thicker than the layers of material constituting the potential barriers within the two superlattices as long as it has a lower transmission coefficient for the charge carriers passing through the device than the potential barriers of the superlattices, i.e. such that a significant part of a voltage applied across the device appears across the barrier layer.

We claim:

1. A semiconductor device exhibiting negative differential conductance, the device comprising two superlattices each comprising alternating layers of two different semiconductor materials such that there is a misalignment of energy band edges between each pair of adjacent layers with the layers of one of the materials constituting potential barriers to charge carriers passing through each superlattices, said superlattices being coupled to each other by a barrier layer of semiconductor material forming respective heterojunctions with the adjacent layers of the superlattices, said barrier layer having a lower transmission coefficient for said charge carriers than said layers of said one material, said superlattices defining the allowed energy levels of said charge carriers at either side of said barrier layer, and the value of a potential applied across said barrier layer determining the current-voltage characteristics of the device.

2. A device according to claim 1 in which said one material and the material of said barrier layer is $Al_xGa_{1-x}As$, and the other material in each superlattice is GaAs.

3. A device according to claim 2 in which $\chi$ is 0.45.

4. A device according to claim 2 in which said layers of GaAs are doped with silicon to put the Fermi level in the first miniband for each superlattice.

5. A device according to claim 4 in which said layers of GaAs are doped in a region spaced away from the adjacent layers of $Al_xGa_{1-x}As$.

6. A device according to claim 1 in which said barrier layer is at least twice as thick as said layers of said one material.

7. A device according to claim 1 in which each of said superlattices is of at least three periods.

8. A device according to claim 1 in which the width of the first miniband for each of said superlattices is less than the optic phonon energy for said one material.

9. A device according to claim 2 in which $\chi$ is 0.25.

* * * * *